United States Patent
Pogge

(10) Patent No.: US 6,333,553 B1
(45) Date of Patent: Dec. 25, 2001

(54) WAFER THICKNESS COMPENSATION FOR INTERCHIP PLANARITY

(75) Inventor: H. Bernhard Pogge, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/316,940

(22) Filed: May 21, 1999

(51) Int. Cl.$^7$ .............................. H01L 23/06; H01L 23/04
(52) U.S. Cl. .......................... 257/730; 257/723; 257/724
(58) Field of Search ................................ 257/701, 702, 257/707, 723, 724, 730, 752, 786

(56) References Cited

U.S. PATENT DOCUMENTS

| | | |
|---|---|---|
| 3,844,858 * | 10/1974 | Bean ........................ 438/16 |
| 4,489,364 | 12/1984 | Chance et al. ................ 361/737 |
| 4,542,397 | 9/1985 | Biegelsen et al. .............. 257/723 |
| 4,670,770 | 6/1987 | Tai ............................ 257/777 |
| 4,709,468 | 12/1987 | Wilson ........................ 29/834 |
| 4,783,695 | 11/1988 | Eichelberger et al. ............ 257/777 |
| 4,884,122 | 11/1989 | Eichelberger et al. ............ 29/834 |
| 4,933,042 | 6/1990 | Eichelberger et al. ............ 257/668 |
| 4,949,148 | 8/1990 | Bartelink .................... 257/785 |
| 4,954,875 | 9/1990 | Clements .................... 257/686 |
| 4,967,146 | 10/1990 | Morgan et al. ................ 824/765 |
| 5,019,535 | 5/1991 | Wojnarowski et al. ........... 438/107 |
| 5,023,205 | 6/1991 | Reche ........................ 216/18 |
| 5,034,091 | 7/1991 | Trask et al. .................. 216/18 |
| 5,091,330 | 2/1992 | Cambou et al. ................ 438/406 |
| 5,168,344 | 12/1992 | Ehlert et al. .................. 257/693 |
| 5,207,866 | 5/1993 | Lue et al. .................... 205/657 |
| 5,229,647 | 7/1993 | Gnadinger .................... 257/785 |
| 5,331,203 | 7/1994 | Wojnarowski et al. ........... 257/698 |
| 5,353,498 | 10/1994 | Fillion et al. ................. 29/840 |
| 5,355,102 | 10/1994 | Kornrumpf et al. ............. 333/33 |
| 5,373,627 | 12/1994 | Grebe ........................ 29/847 |
| 5,432,681 | 7/1995 | Linderman .................... 361/790 |
| 5,770,884 | 6/1998 | Pogge et al. .................. 257/506 |
| 5,814,885 | 9/1998 | Pogge et al. .................. 257/730 |
| 5,866,443 | 2/1999 | Pogge et al. .................. 438/110 |
| 5,998,868 | 12/1999 | Pogge et al. . |

FOREIGN PATENT DOCUMENTS 0 417 345 A1    3/1991   (EP) .

OTHER PUBLICATIONS

Talghader et al., "Integration fo Fluidically Self–Assembled Optoelectronics Using a Silicon Based Process", 11/95, IEEE Photonics Technology Letters vol. 7 No. 11.*

M. Gdula, et al, "A 36–Chip Multiprocessor Multichip Module With The General Electric High Density Interconnect Technology" IEEE, V.91, pp 727–730, 1991.

H. Linde, et al, "Wet Silicon Etching With Aqueous Amine Gallates" Jrl. Electrochemical Soc., V.139, #4. pp. 1170–1174, Apr. 1992.

(List continued on next page.)

Primary Examiner—Minh Loan Tran
Assistant Examiner—Thomas L Dickey
(74) Attorney, Agent, or Firm—McGuireWoods, LLP; Joseph P. Abate

(57) ABSTRACT

An integrated circuit package having a carrier and semiconductor circuit chips are disclosed. The carrier has a topography of mesas projected from its surface. Each of the semiconductor circuit chips has a device side surface and an opposite bottom surface, which has a topography of a recess conversely matching a respective one of the mesas of the carrier for self-alignment positioning on the carrier. To offset the variation in the thickness of the semiconductor circuit chips, the width of the recess in each semiconductor circuit chip is controlled so that the alignment of the recess on its respective mesa elevates the bottom surface of the semiconductor circuit chip. Therefore, the device side surfaces of the semi conductor circuit chips are placed in the same plane.

10 Claims, 8 Drawing Sheets

OTHER PUBLICATIONS

Marketing Materials, "High Density Multichip Interconnect–Reliability Data" Hughes Microelectronic Circuits Division, A Subsidiary of GM Hughes Electronics, Newport Beach, CA 3 pages, post 1992.

R. J. Wojnarowski, et al. "Three Dimensional Hybrid Wafer Scale Integration Using the GE High Density Interconnect Technology" IEEE Confedrence on Wafer Scale Integration, Ses. 7,WSI Tech. 1–p308–316 1993.

M. Despont, et al. "New Design of Micromachined Capacitive Force Sensor" Jrl. of Micromechanics & Micrengineering V 3, #4, pp. 239–242, Dec. 1993.

D. Sander, et al., "Fabricationof Metallic Microstructures by Electroplating Using Deep–Etched Silicon Molds Molds" IEE, Jrl. of Microelectromechanical Systems, V.4 #2, pp. 81–86, Jun. 1995.

J. Talghader, et al., "Integration Fluidically Self–Assembled Optoelectronic Devices Using a Silicon–Based Process" IEEE Photonics Technology Letters, vol. 7, No. 11, Nov. 1995.

J. J. Talghader, et al., "Integration of Fluidically Self–Assembled Optoelectronics Devices Using a Silicon–Based Process", IEEE Photonics Technology Letters, vol. 7, No. 11, 11/95.

George et al.; "Packaging Alternatives to Large Silicon Chips: Tiled Silicon on MCM and PWB Substrates"; IEEE Transactions On Components, Packaging and Manufacturing Technology –Bart B., vol. 19, No. 4, Nov. 1996; pp. 699–708.

Talghader et al.; "Integration of Fluidically Self–Assembled Optoelectronic Devices Using a Silicon–Based Process"; IEEE Photonics Technology Letters, vol. 7, No. 11, Nov. 1995; pp. 1321–1323.

* cited by examiner

WAFER THICKNESS COMPENSATION FOR INTERCHIP PLANARITY

BACKGROUND OF THE INVENTION

1. Field of the Invention

The present invention generally relates to manufacture of multichip integrated circuit device configurations, and in particular to techniques for assuring that the device sides of chips in such configurations are in the same plane.

2. Background Description

As advances in semiconductor processing occur, the scale of individual integrated circuit devices continues to shrink, making it possible to incorporate increasing amounts of functionality in a single integrated circuit chip. For example, sixteen 1 MBIT Dynamic Random Access Memory (DRAM) chips of equal size in 1984 required a total chip area of 800 mm$^2$, while a single 16 MBIT design containing the same functionality in 1990 required only 110 mm$^2$. Thus, although the individual chip size has increased by approximately 50%, the net chip area has been reduced by a factor of 8. Accordingly, as integrated circuit chips are required to incorporate more and more functionality, the size of the chips has been steadily increasing.

However, there are practical problems associated with continually increasing the maximum chip size. A first set of problems relates to the physical limits of present day fabrication equipment. For example, state-of-the-art manufacturing lithography equipment commonly used to expose high resolution patterns through masks onto semiconductor substrates effectively limits chip size to the size of the lithography exposure field of the equipment. The size of the direct exposure field of state-of-the-art manufacturing lithography equipment in the mid 1990s is generally on the order of 25 mm in diameter, allowing square chip design exposure of about 324 mm$^2$ (18 mm×18 mm). Most DRAM chip designs in development are rectangular and tend to be 20 mm×10 mm, or larger. While a mask larger than the lithography exposure field of the equipment can be split into multiple smaller masks that are "stitched" together to effectively multiply the size of the lithography exposure field, such "stitching" introduces undesired inaccuracies and occupies valuable space on the semiconductor substrate. A solution to the exposure field/stitching problem is to develop fabrication equipment having a larger exposure field and, therefore, the capability to manufacture larger chips without stitching masks together. However, such a solution would require massive financial investment in research and development.

Additionally, in order for a wafer to produce a large enough number of chips to make the manufacturing of larger chips practical, semiconductor wafers would need to migrate to a larger size, thereby requiring further substantial investment in the development of new crystal pulling equipment, and wafer processing and handling equipment.

Another problem relates to the general trend of wafer yields decreasing with increasing chip size. FIG. 1 summarizes different manufacturing chip yields as a function of the chip edge dimension (square chips). It will be observed that as the chip area increases, the effective chip yields reduce nearly linearly. The different curves relate to different design complexities, with the topmost curve being the least complex and the bottommost curve being the most complex of the three exemplary curves. The decrease in yield with increasing chip size can be attributed to the fact that for the same quality of semiconductor, any defect existing in a larger chip results in an overall greater area waste than is the case with smaller chip wafers. As chip size increases, the cost of manufacturing due to yield degradation becomes prohibitive.

Conventional multi-chip modules (MCM's) avoid the problems associated with producing large chips by combining a plurality of small-sized chips in a larger package. For example, U.S. Pat. No. 4,489,364, assigned to IBM, discloses a ceramic chip carrier for supporting an array of chips by means of solder balls. However, such MCMs tend to be extremely expensive due to their multilayered ceramic features and they require significantly more area than the net overall area of the combined set of chips.

Other similar approaches include the High Density Interconnect (HDI) structure proposed by the General Electric Company and generally described in IEEE magazine, 1991, "A 36-Chip Multiprocessor Multichip Module made with the General Electric High Density Interconnect Technology". However, the HDI technology offers poor positional accuracy of chips, preventing the use of a fixed mask to make chip-to-chip connections, and thereby making the process of interconnecting individual chips extremely time consuming and expensive.

An improved integration scheme for combining, in close proximity, a plurality of semiconductor die units is described in U.S. Pat. No. 5,814,885 to Pogge et al., which provides an integrated circuit package including a carrier having a surface topography of projections or recesses for supporting individual semiconductor circuit chips having a conversely matching bottom surface topography to permit self-aligned positioning of the chip on the carrier.

However, there is a further need, within the foregoing integration scheme, to provide for differing chip thicknesses, since the chips which are integrated by the self aligning surface projections or recesses will typically originate from different wafer sources tending to have different wafer thicknesses. Typical device wafers vary in thickness from wafer to wafer within about 1–3 μm. When such wafers are used in a precisely integrated chip process, such thickness variations can result in chip-to-chip non-planarities which adversely affect overall process and product efficiency. Where different chip macros are being placed closely together and then interconnected with standard metallization photo masks, it is desirable to have the device side of the chips be planar to each other.

Specific wafer sorting can reduce thickness variations, but remaining differences can create non-planarities of as much as 1–1.5 μm. Individual chips can be polished to the same thickness, but this becomes difficult on a chip by chip basis and requires unique polishing tool capabilities. Another approach is needed to compensate for variations in wafer thickness.

SUMMARY OF THE INVENTION

It is an object of the present invention to provide interchip planarity in a very dense integrated circuit package where circuit chips are assembled on a carrier in a self-aligned manner.

It is another object of the present invention to provide interchip planarity in a cost effective manner suitable for a large scale production environment.

These and other objects of the invention are achieved by controlling the width of beveled recesses in the bottom surface of semiconductor chips, so that alignment on conversely matching surface topography on the carrier will elevate thinner chips above the carrier by a thickness offset, which is an amount equal to the difference between the thickness of the thinner chip and a reference chip thickness. For a plurality of source wafer thicknesses, the reference chip thickness must be set at least as large as the thickness of the thickest source wafer.

In one embodiment, photolithographic exposures on the back side of the thinner semiconductor chips are modified to create a narrower photopattern opening for recesses, in an amount geometrically related to the thickness offset. This is followed by anisotropic etching of the recesses. When a respective chip is then seated on respective bevel sided mesas on the carrier, the sides of a chip's narrowed cavities will abut the sides of the corresponding carrier mesas at a point which leaves a space equal to the thickness offset between the carrier surface and the back side of the chip.

In a preferred embodiment, the photolithographic exposures on the back side of the semiconductor chips are the same and are set for a width which is no greater than the width required to elevate the thinnest chip a thickness offset distance above the carrier surface. However, the time of the anisotropic etching is controlled to produce the desired narrowing of the cavity widths, so that when a chip is seated to a point where the sides of the cavity abut the sides of the corresponding carrier mesas, there will be an elevation between the carrier surface and the back side of the chip equal to the thickness offset. This embodiment is preferred because it avoids the need for separate modifications of the photopattern mask based on the different thickness offsets of each chip.

BRIEF DESCRIPTION OF THE DRAWINGS

The foregoing and other objects, aspects and advantages will be better understood from the following detailed description with references to the drawings, in which:

FIG. 4A is a top view of a partial section of the carrier substrate surface and FIG. 4B is a cross-sectional view taken from the perspective indicated in FIG. 4A.

DETAILED DESCRIPTION OF A PREFERRED EMBODIMENT OF THE INVENTION

The present invention applies to a very dense integrated circuit package, including a carrier having a surface topography of projections or recesses with sloping sides for supporting individual semiconductor circuit chips, where each chip has a conversely matching bottom surface topography to permit self-aligned positioning of the chip on the carrier. That very dense integrated circuit package will first be described.

As an example of the very dense integrated circuit package, aforementioned U.S. Pat. No. 5,814,885 will be described more in detail hereafter since the features in U.S. Pat. No. 5,814,885 are relevant to understand the problems of conventional art.

Figure 2A:
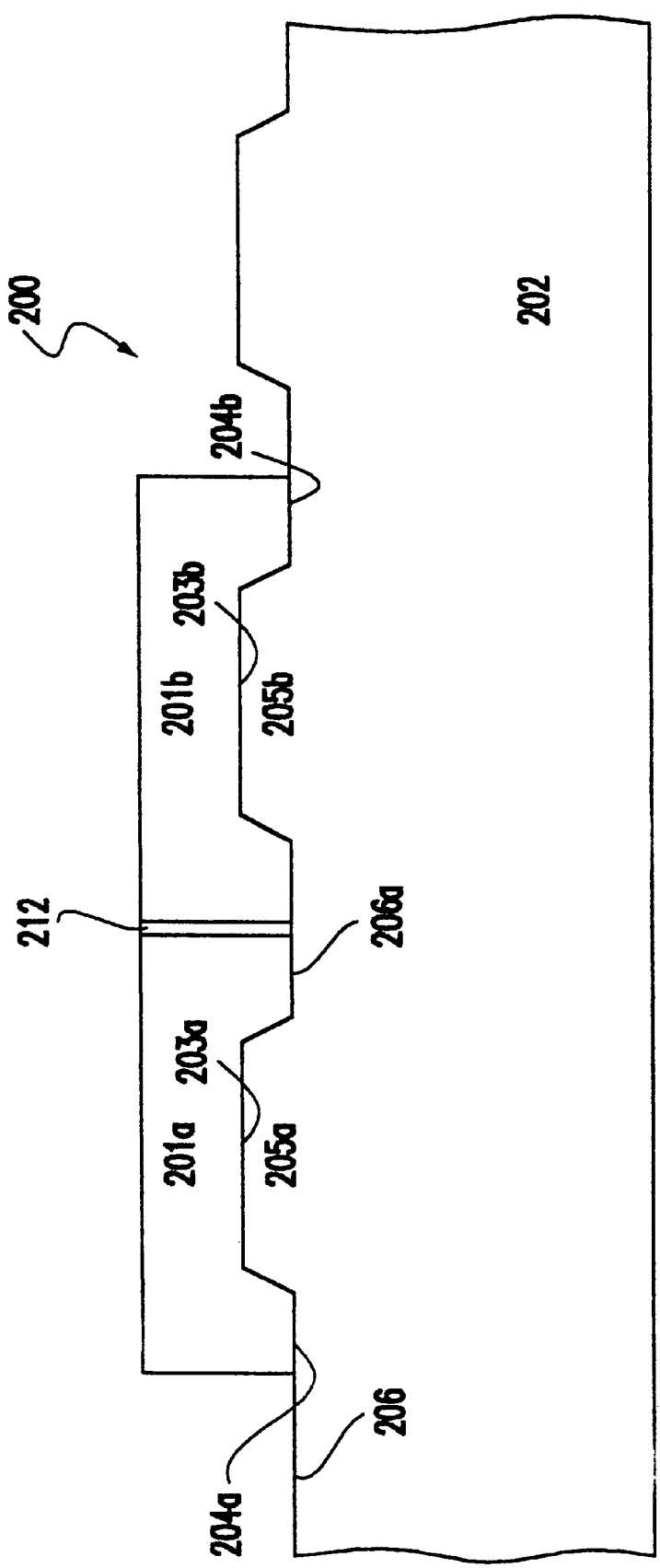
FIG. 2A depicts a chip and supporting substrate marriage according to a first embodiment of the invention.

With reference to FIG. 2A, a chip-on-substrate assembly 200 of the invention is shown in which integrated circuit chips 201a,b are positioned on a carrier substrate 202 by interfitting surface depressions 203a,b on the bottom faces 204a,b of the chips 201a,b with corresponding projections 205a,b extending from the upper face 206 of the carrier substrate 202. Although two chips are shown as positioned on the substrate for illustrative purposes, it will be understood that the description encompasses positioning a single chip or a plurality of chips on a substrate. The chip depressions 203a,b can be a two-walled trench or a four-sided well configuration, where the carrier substrate projections 205a,b will have a corresponding configuration of either an read-up-raised ridge or a mesa-like structure, respectively.

Figure 2B:
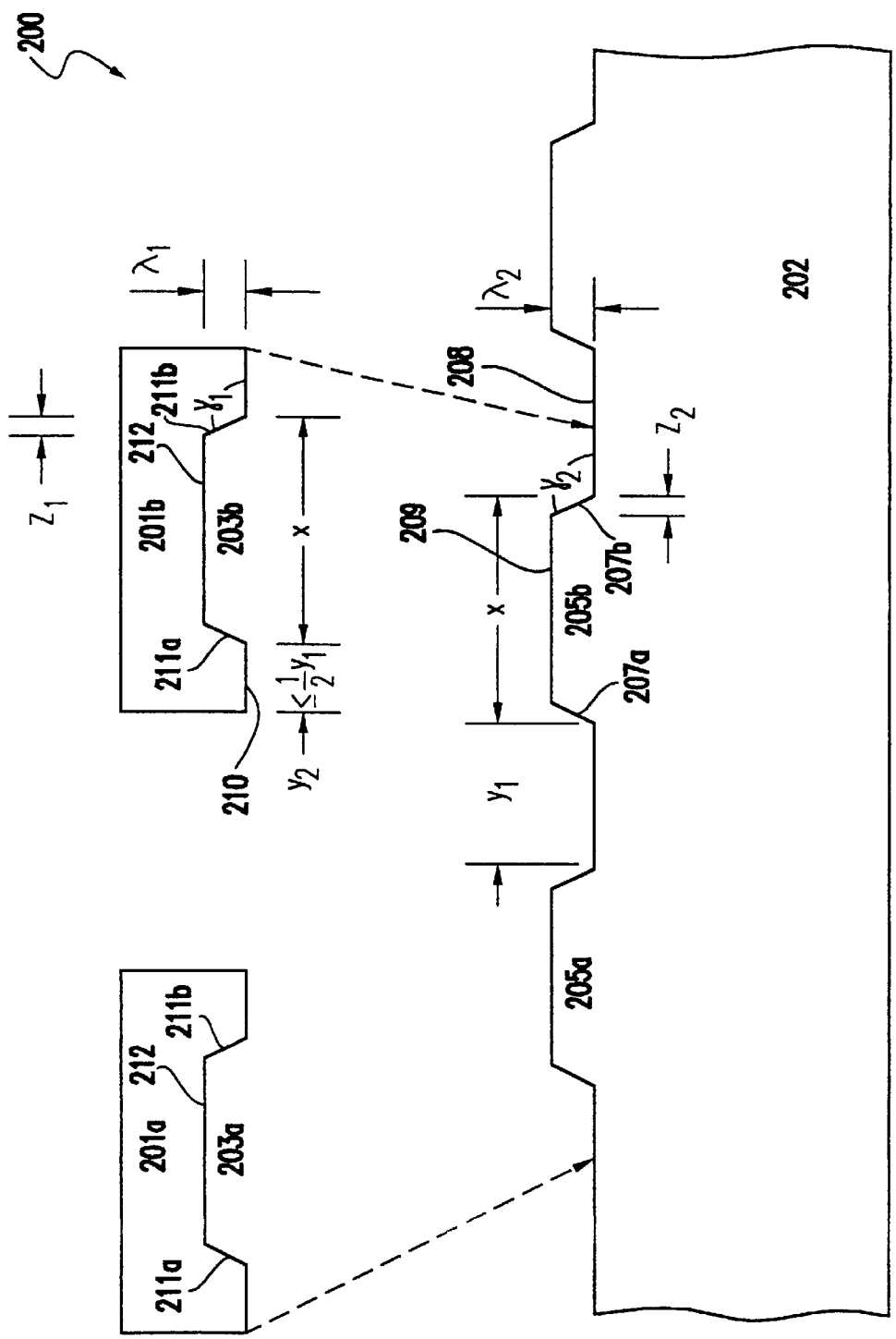
FIG. 2B is a fractured representation of the chip-on-substrate assembly shown in FIG. 2A to clarify the dimensions.

As shown in FIG. 2B, and by reference to the chip 201b the and projection 205b for sake of simplicity, the projection 205b each has a lateral dimension "x" extending from where the first sloping sidewall 207a borders the planar substrate base 208 across the projection flat 209 to where the second sloping sidewall 207b borders the planar substrate base 208 again. In order to be able to insert and conformally match the contour of the surface depression 203b with the contour of the projection 205b, the surface depression 203b also has a lateral extent "x" extending from where the outer planar chip portion 210 borders the beveled edge 211a of the depression 201b across the recess flat bottom 212 to where the second beveled edge 211b borders the outer planar chip face 210 again. In order to ensure a conformal flush contact between the chip depression 203b and the substrate projection 205b, the depth $\lambda_1$ of the chip depression 203b will be essentially the same as the height $\lambda_2$ of substrate projection 205b; the lateral extent "$z_1$" of the beveled depression edges 211a,b will be essentially the same value as the lateral dimension "$z_2$" of the sloping sidewalls 207a,b; and, additionally, the angle of inclination $\gamma_1$ of the beveled edges 211a,b of the chip depression 203b is essentially the same as the angle of inclination $\gamma_2$ of the sloping sidewalls 207a,b of the projection 205b. For purposes of this illustration, chips 201a and 201b have identically dimensioned surface depressions 203a,203b formed therein, which means that carrier substrate projections 205a and 205b also have identical dimensions. A combination of different sized chips and/or chips having different shapes defined by their peripheral edges (e.g., mixtures of squares and rectangles, and so forth) can be positioned on a common carrier substrate, although the chip depressions and carrier substrate projections should have the same vertical dimensions from chip-to-chip.

Also, where more than one circuit chip 201a,b are positioned side-by-side on projections 205a,b on the carrier substrate 202, as illustrated in FIG. 2A with the related dimensions indicated in the fragmented view of FIG. 2B, a lateral dimension "$y_1$" must be maintained between the projections 205a,b which is greater than or equal to the dimension "$y_2$" of chip outer face portions 210 so that there is room for both chip outer face portions 210 of adjoining chips 210a,b to fit on the planar substrate base portion 206a between projections 205a,b. It is desirable to size $\gamma_2$ of adjacent chips 201a,b to leave a lateral gap 212 (see FIG. 2A) between the chips 201a,b as positioned on projections 205a,b. The lateral dimension of the space between the chips, i.e., the marginal chip-to-chip spacing defined by gap 212, can be well-controlled to provide appropriate spacing between the chips 201a and 201b. For example, where chips 201a and 201b are intended to ultimately remain side-by-side in close proximity to each other in the finished electronic package, the spacing of gap 212 can be reduced to approximately 1 µm, while, on the other hand, gaps between chips 201a and 201b that will be used as dicing streets, for instance, can be made larger in width, e.g., up to about 100 82 his gap 212 can be filled by a material (not shown) having a flowable state to facilitate complete filling of the gap 212 to provide a planar wafer surface available for further processing steps such as metallization procedures, and the gap filling material should be selected as a material able to tolerate the heat associated with metallization operations, e.g., epoxy, polyimide or SOG.

When the depressions 203a,b on the bottom faces of the integrated circuit chips 201a,b and the carrier projections 304 on the upper face of the carrier substrate 202 are formed by crystallographic orientational etching, as described in more detail elsewhere herein, the integrated circuit chips 201a,b and carrier 202 are substantially self-aligning to each other, thereby easing insertion and some dimensional tolerances while still producing a precise result. Precise placements of the circuit chips on the chip carrier substrate have been achieved in the range of 0.2 to 0.3 µm, and chip-to-chip spacing can be reduced to approximately 1 µm, in the present invention.

Additionally, the carrier substrate 202 and integrated circuit chips 201a,b can optionally be provided with juxtaposed thermally conductive contacts or regions at the chip-to-carrier interface to facilitate heat dissipation during processing.

Figure 3A:
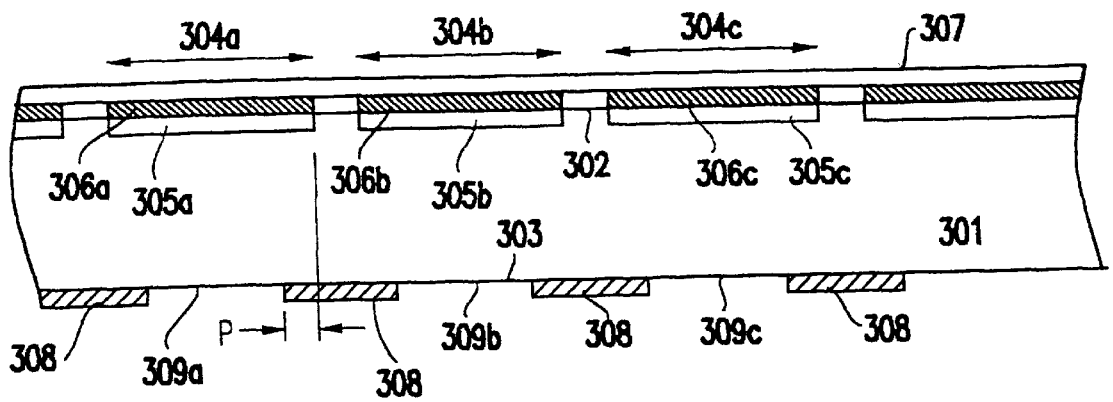
FIGS. 3A to 3C depict a method for forming a lithographically defined integrated circuit chip having a surface depression formed in the bottom face.
Figure 3B:
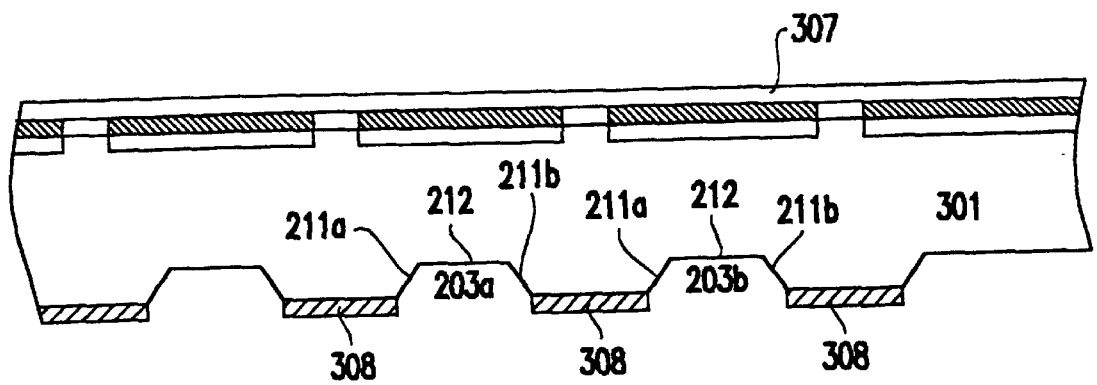
Figure 3C:
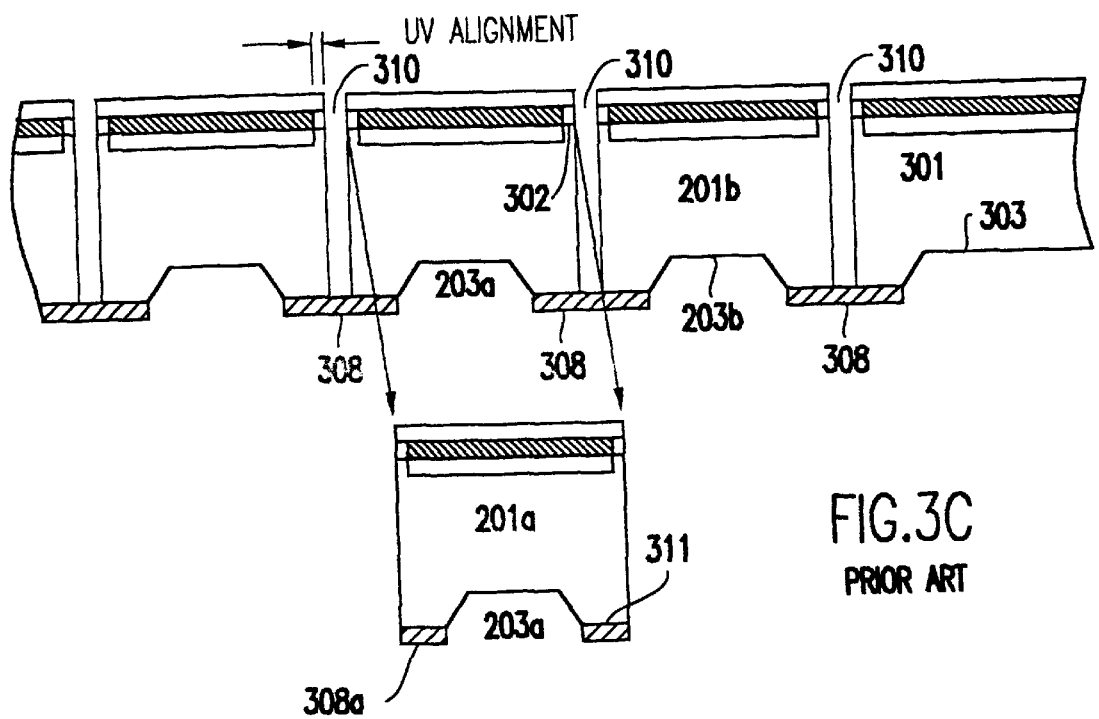

With reference to FIGS. 3A–3C, an exemplary method for forming the discrete integrated circuit chips 201a,b having the depressions 203a,b used for positioning the chips 201a,b on substrate projections 205a,b is described. As shown in FIG. 3A, a semiconductor chip substrate material 301 (e.g. a single crystal wafer) has an active surface 302, which represents the top surface of chips, and a passive surface 303, which represents the bottom surface of the chips. The active surface 302 is generally the side of the substrate on which the electronic devices are formed, and chip substrate 301 has several active areas 304a,b,c shown as already formed in active surface 302. The semiconductor substrate 301 may be silicon, germanium, gallium arsenide, CdSe, a compound of a Group II element and a group VI element, a compound of a Group III element and a group V element. The thickness of the wafer is relatively thin relative to the surface area presented. For this embodiment, the wafer thickness must be thick enough to allow the surface depressions 203a,b, etc. to be formed in the bottom face of the chip wafer without disturbing or otherwise affecting the opposite active side of the wafer. The wafer thickness can be a standard wafer thickness in the industry, such as about 700 to 800 µm for a 200 mm diameter wafer, although it is not limited thereto.

The semiconductor chip substrate 301 has been previously processed by conventional techniques so as to fabricate integrated circuit devices generally indicated at 305a, b,c within the active areas 304a,b,c. The fabrication methods may vary with the type of integrated circuit devices desired, for example, bipolar, CMOS, biCMOS etc. After devices 305a,b,c have been formed in the active areas 304a,b,c, local metallization is provided. Conventional metallization techniques may be used. A first metallization layer 306a,b,c is deposited over the active areas 304a,b,c to selectively form connections between devices 305a,b,c within the same active area 304a,b,c. Preferably, additional metal layers (not shown), sufficient for enabling the testing of the finished integrated circuit chip, are also deposited at this step. Such testing preferably provides the ability to screen out defective integrated circuit chips after testing and prior to incorporating them into a larger package, thereby enhancing overall yield of the ultimate assembly.

After local metallization and testing, the active surface 302 of the semiconductor substrate 301 is coated with a protective layer 307 to shield the active areas 304a,b,c during further processing. The protective layer 307 preferably comprises one of many polymers (for example, polyimide), which are readily applied, are surface conformal, have adequate thickness (approximately 1–5 µm), and can withstand subsequent processes. After the protective layer 307 is placed on the active surface 302, the passive surface 303 of the chip substrate material 301 is covered with a silicon dioxide etch mask 308 formed thereon by growing or depositing a silicon oxide layer on wafer surface 303 by conventional techniques, and mask layer 308 is photolithographically patterned by conventional techniques to define exposed surface regions 309a,b,c of the passive surface 303. While silicon oxide is preferred for mask layer 308, other conventional mask materials used for anisotropic wet etching of silicon wafers also could be used. The mask layer 308 has an alignment "p" beneath the active areas 304a,b,c as shown in FIG. 3A.

With reference now to FIG. 3B, crystallographically anisotropic etching is performed on the exposed passive surface regions 309a,b,c using masking layer 308 as a mask resulting in removal of surface matter from chip substrate 301 at rates which differ depending on crystallographic direction. The preferential etching is applied to the bulk portions of the chip substrate material 301. In order to employ crystallographic orientation selective etching, the substrate 301 is chosen to have a particular crystalline orientation. For example, in FIGS. 3A through 3C the semiconductor chip substrate 301 can be a <1 0 0> semiconductor wafer; that is, a single crystal semiconductor wafer having patterns of active surface 302 and passive surface 303 each aligned with <1 1 0> directions. The following discussion describes the beveled side edges 211a,b formed for a <1 0 0> semiconductor wafer, but reference features of varying shapes can be formed when using wafers of other orientations, or other etching techniques. In any event, the anisotropic wet etch of the chip substrate 301 in the areas 309a,b,c forms recesses 203a,b, etc., in the bottom wafer surface 303 comprised of beveled side edges 211a and 211b terminating on a flat bottom 212. The wet anisotropic etchants that can be used, include, for example, potassium hydroxide (KOH), hydrazine, quaternary ammonium hydroxides, and ethylenediamine solutions, as disclosed in the Journal of the Electrochemical Society (JECS), Vol. 139, No. Apr. 4, 1992, pages 1170–1174, which teachings are incorporated herein by reference. These etchants, due to their anisotropic nature, have differential etch rates for different crystallographic planes, thereby creating a tapered or beveled side edge in the recess created. For example, using KOH etchant on a <1 0 0> silicon wafer, the etch angle will be 54.7° relative to the <1 0 0> plane, which means that the supplementary angle formed between either of the beveled side edges 211a and 211b of recesses 203a,b and wafer surface 303 will be 125.3° (i. e., angle $\gamma_1$ shown in FIG. 2B).

The geometric dimensions of the exposed passive surface areas 309a,b,c have the important function of controlling the lateral dimensions of the beveled recess edges 211a,b. Since the silicon etch is anisotropic, once the full <1 1 1> crystal surface is exposed it will thereafter form the planar recess bottom 212.

With reference to FIG. 3C, deep trenches 310 are then formed by a standard dicing technique through the active surface 302 of the chip substrate 301 around designated active areas 304a,b,c, which extend from the active surface 302 into the body of the semiconductor substrate 301. The deep trenches 310 define the perimeter area dimensions of the integrated circuit chips. In this package, an individual chip or a group of chips suspended on a common die unit can be positioned on the carrier substrate using the "key" formations formed underneath the chips and on top of the chip carrier substrate.

Before the depression 203a of circuit chip 201a is positioned upon a corresponding projection 205b of a carrier substrate 202, as shown in FIG. 2A, the remaining silicon oxide mask portions 308a shown in FIG. 3C can be removed and an appropriate surface binder (not shown) can be applied to the then exposed planar outer chip surfaces 311 on the bottom face of the chip. For example, polyimide may be applied at a temperature of 100° C. by standard application methods. The binder material may also have thermally or electrically conductive properties to allow heat transmission. The integrated circuit chips 201a,b, etc. are then placed on the carrier substrate projections such that the metallization layer 306a,b, etc., are facing up.

Figure 4A:
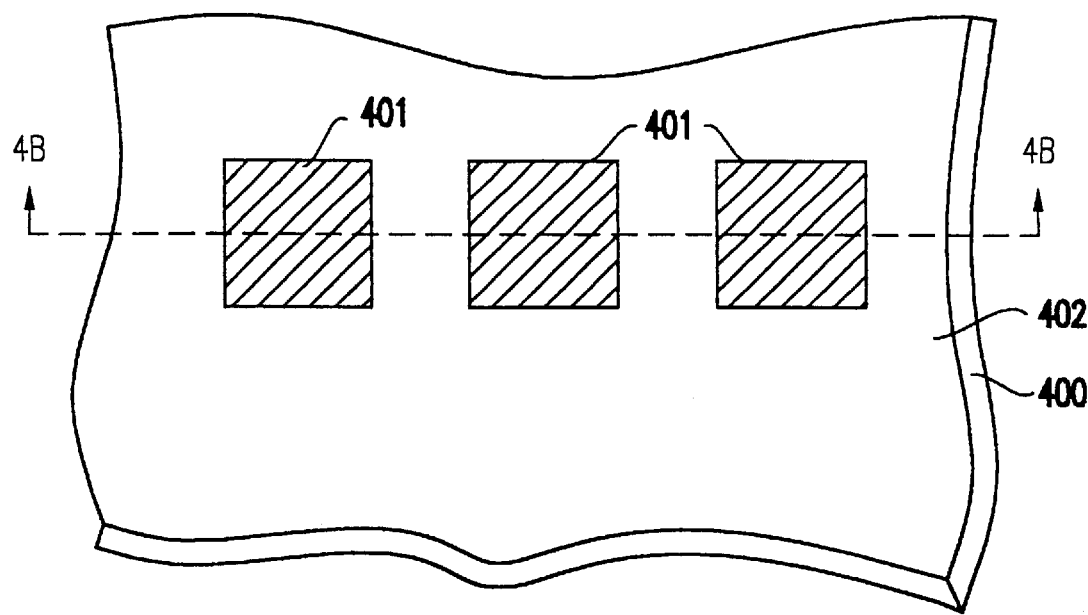
FIGS. 4A to 4B depict a method for forming lithographically defined projections on the upper surface of a carrier substrate for holding integrated circuit chips, where
Figure 4B:
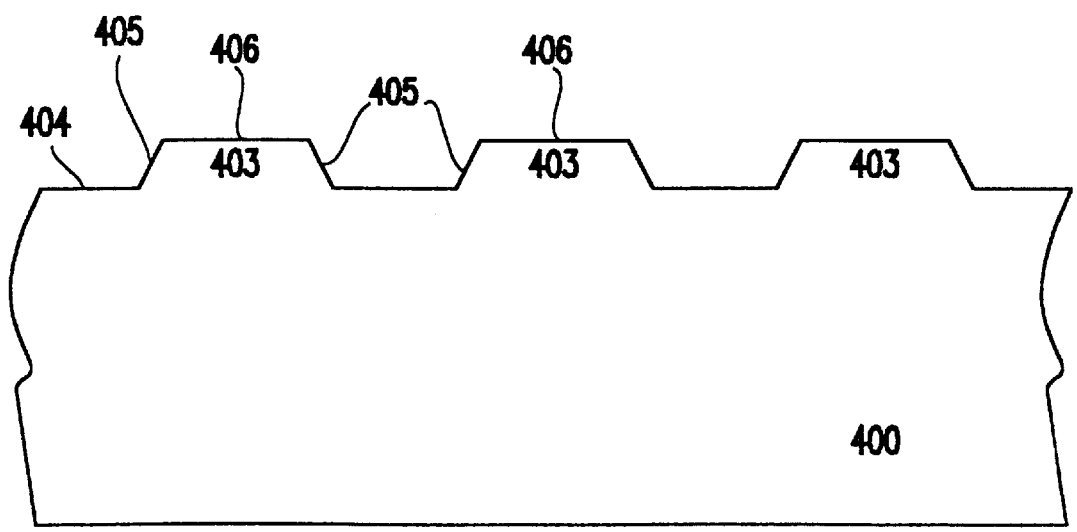

With reference to FIGS. 4A and 4B, a method for forming a carrier substrate, such as the sort exemplified as carrier substrate 202 shown in FIG. 2A, for positioning a plurality of integrated circuit chips will now be described. First, a carrier substrate 400 is provided. Typically, the carrier substrate will have a larger surface area than a circuit chip to be supported thereby, so that a plurality of circuit chips can be attached to a common carrier substrate.

The carrier substrate 400 is preferably crystallographic and more preferably a semiconductor, such as single crystal silicon, germanium, gallium arsenide, CdSe, a compound of a Group II element and a group VI element, or a compound of a Group III element and a group V element. The carrier substrate 400 preferably has a crystallographic orientation and a thermal coefficient of expansion similar to those of the circuit chips to be held. More preferably, the carrier substrate 400 is the same material as the semiconductor chip substrate 301 used in the fabrication of the circuit chips, such as chips 201a,b described supra.

With reference to FIG. 4A, a silicon dioxide masking layer 401 is formed on the upper face 402 of carrier substrate 400 and patterned by conventional photolithographic techniques to expose the upper face 402 at locations surrounding the remaining islands of mask 401. As above, silicon oxide is merely a preferred mask layer material, and masking layer 401 is not limited thereto, as other conventional mask materials used for anisotropic wet etching of silicon wafers also could be used. After such patterning, the semiconductor substrate 400 is crystallographically anisotropic etched using similar techniques as described above in connection with the formation of the surface depressions in the circuit chips per the discussion of FIG. 3B. That is, carrier substrate 400 can be selected to be a <1 0 0> semiconductor wafer and the wet anisotropic etchants described above for forming the depressions, viz. a four-sided trenches, in the bottom surface of the chips, are equally useful to form the corresponding projections on the surface of the carrier substrate.

However, an important difference is that the mask pattern 401 used in the crystallographic anisotropic etching of the carrier substrate 400 is the opposite, i. e., a "negative" in a photographic sense, of the mask pattern 308 used for etching the depressions 203a,b in the chip substrate 301. As a consequence, and as shown in FIG. 4B, projections 403 are formed having sloping sidewalls 405 rising from the planar base portion 404, which is a new upper surface portion revealed by the etching, to a planar projection top surface 406, where the projection top surface 406 is comprised of the original upper face 402 of the carrier substrate 400. By using crystallographic anisotropic etching in this manner on similar materials for both the chip substrate and the carrier substrate, it is possible to form surface depressions in the chip bottoms which counter-correspond to the profile of the projections formed in the surface of the carrier substrate. Therefore, when the depressions (recesses) in the chip bottoms are positioned on their corresponding carrier substrate projections, a conformal interfit is achieved to provide a robust mechanical interlock of the components.

The projections 403 formed from the photolithographic pattern shown in FIG. 4A are illustrated as four-sided mesa-like structures having four sloping sidewalls. It can be understood that if an etch mask stripe is provided to extend from one edge of the carrier substrate to an opposite edge thereof, that a ridge-like projection would be created by the etching procedure. Such a ridge-like projection on the carrier substrate would be needed where a trench-like depression (i. e., two spaced beveled edges extending along a common flat trench bottom) is formed on the bottom surface of a chip from one edge thereof to the other for chip positioning purposes.

Conventional chip handling and placement tools, such as robotic placement chucks and vacuum probes capable of controlled x-y movement, may be used to position an integrated circuit chip in a very dense package as described herein, such that its surface depression is interfitted with a corresponding surface projection provided on the carrier substrate surface. The circuit chips to be placed onto the carrier substrate projections will be given the appropriate orientation by having them aligned with the help of an orientator. Further, the integrated circuit chips can be placed into an inclined hopper and can slide into a corner serving as an orientation reference point. Once the circuit chip is properly oriented, a robotically controlled vacuum probe will place the chip onto carrier substrate projections, the orientation of which has been similarly aligned. Once in place, the chips are mechanically agitated to insert fully onto the carrier substrate projections. If required, assistance of an optical flat platen can be used to assure complete insertion.

Optionally, one or more pressure relief holes (not shown) can be drilled through the carrier substrate, preferably prior to assembly, in order to relieve pressure created by trapped gases. Suitable drilling techniques include laser ablation, ion beam milling or cryogenic plasma etching.

The approach described above enjoys various advantages. Since the respective depressions and projections provided in both the integrated circuit chips and the carrier substrate are defined lithographically, and created with anisotropic etching methods, the respective dimensions are highly controllable.

The ability to control critical dimensions to extremely precise tolerances makes possible the use of a fixed mask for the final metallization steps rather than more expensive methods, thereby reducing the cost of manufacturing the assemblies. The method also reduces the overall areal size of the assembly due to smaller space requirements.

Improved overall chip yields of such chip assemblies over single large area chips having similar functionality derives from the generally superior yields of smaller chips coupled with pretesting of such chips prior to final assembly. Further, dissimilar integrated circuit chips (e. g. silicon, gallium arsenide, etc.), requiring different processing conditions, may be included in a final chip assembly.

Method for Compensating for Wafer Thickness Variations

Figure 1A:
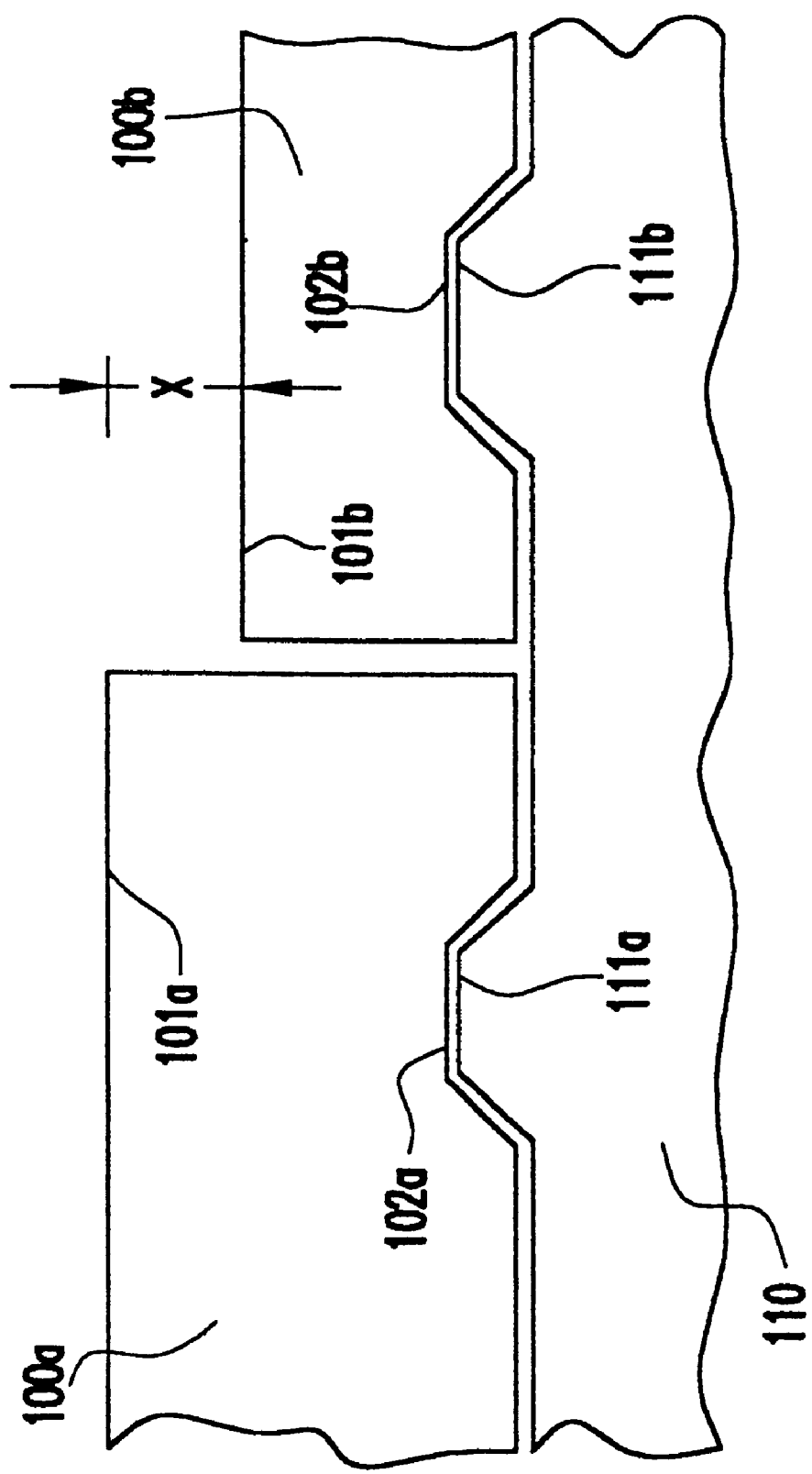
FIG. 1A is a cross sectional schematic showing two adjacent chips, having different thicknesses, in a self aligning very dense integrated circuit package.

In an integrated chip assembly as described above, different chips may originate from different wafer sources and therefore have different thicknesses corresponding to the varying thicknesses of the different wafers. In a typical assembly environment where a wafer may have a nominal thickness of 750 $\mu$, wafer thickness may vary from 1 to 3 $\mu$m. As shown in FIG. 1A, variation in this range between adjacent chips in an integrated chip assembly will mean that the device sides (101a,b) of adjacent chips (100a,b), fully seated on a carrier 110 by self alignment of chip cavities (102a,b) over corresponding carrier projections (111a,b), will be in planes separated by a distance "x" of from 1 to 3 $\mu$m (not drawn to scale).

Figure 1B:
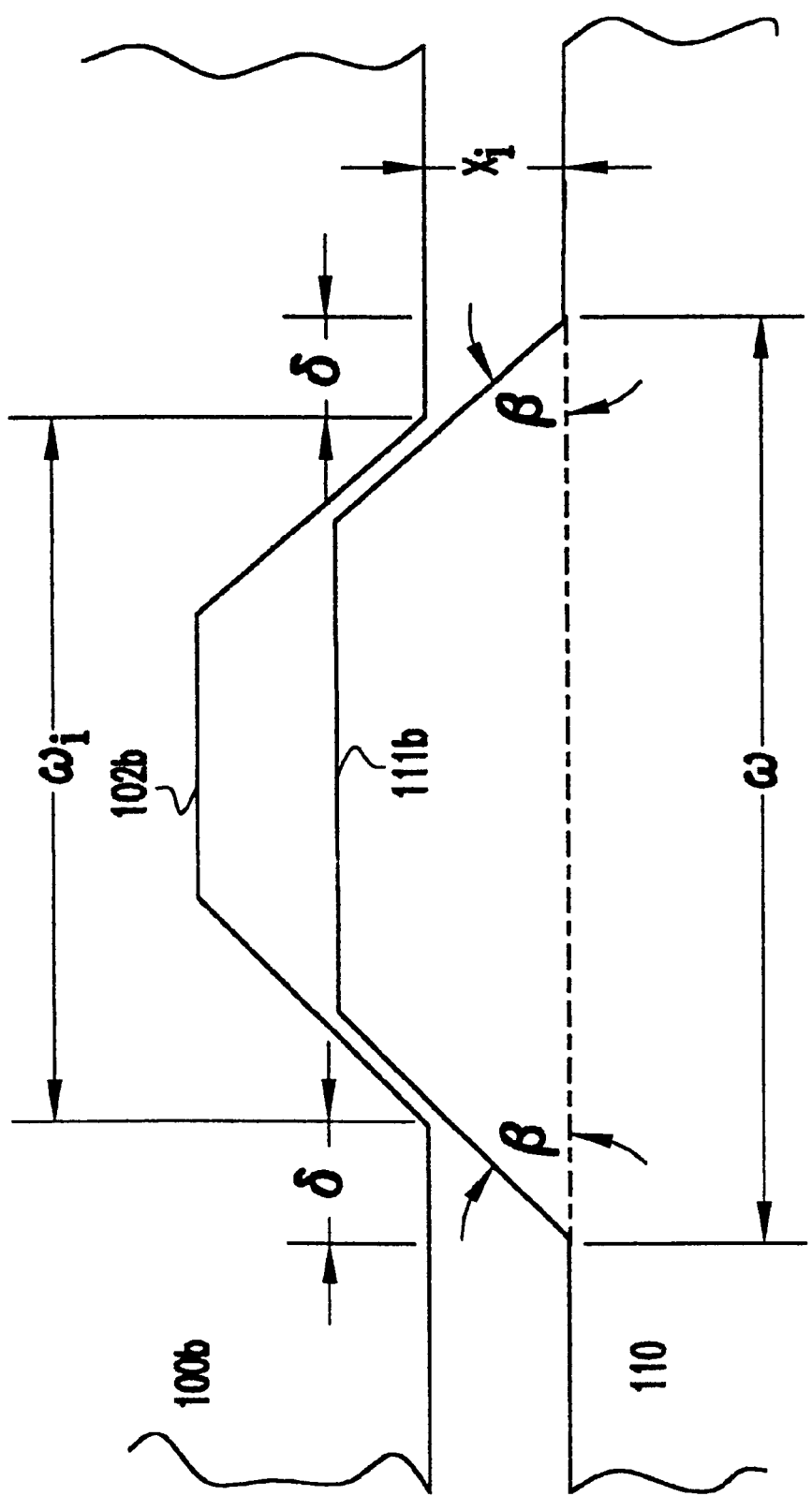
FIG. 1B is a cross sectional schematic showing the geometry associated with elevating a thinner chip in accordance with the invention.

Because thickness difference "x" is of the same order of magnitude, but smaller, than the height of carrier projections (111a,b), and because the sides of the carrier projections (111a,b) and corresponding cavities (102a,b) are sloping, it is feasible to achieve planarity of chip device sides (101a,b) by narrowing the width of thinner chip cavity (102b). The amount by which the chip cavity (102b) must be narrowed is geometrically related to thickness difference X and the slope of the sides of the carrier projection (111b) and corresponding cavity (102b), as will now be shown with reference to FIG. 1B.

Carrier 110 has mesa 111b of width W and sides which slope inward at etch angle $\beta$, the width w being measured along the plane from which the mesa projects. The thickness difference $x_i$ for chip i is seen to be one leg of a right triangle whose opposite leg $\delta$ is related to X and $\beta$ by the relationship $\tan\beta = X/\delta$. Thus it is evident that the desired width $W_i$ (being measured along the plane out of which the cavity is formed) is $$w_i = w - 2\delta = w - 2(x_i/\tan(\beta)) \quad (1)$$

If, as described above, the carrier and chip are taken from a <1 0 0> silicon wafer where the etch angle $\beta$ is 54.7° relative to the <1 0 0> plane, Equation (1) reduces to $$w_i = w - \rho x_i = w - 1.4 x_i \quad (2)$$

where offset factor $\rho$ is a function of the etch angle $\beta$, to wit: $\rho = 2/\tan(\beta)$. It should also be noted that for any group of chips in an assembly, the thickness offset $X_i$ for the ith chip is determined by comparison to a reference wafer thickness that must be at least as large as the thickness of the thickest chip in the assembly. Furthermore, the width W corresponding to $X_i=0$ for this reference wafer thickness will be equal to the width of the mesas projecting out of the carrier. Typically, the reference wafer thickness will be the thickness of the thickest chip in the assembly.

The desired reduction in width may be accomplished in several ways. First, the mask pattern for the underside of the chip may be adjusted so that a chip cavity of the desired width is produced as part of the normal lithographic process. This lithography controlled process requires separate adjustments to the mask pattern for each different wafer thickness.

Second, alternatively, a common mask width may be used for all chips in an assembly, followed by timed anisotropic etching to achieve the desired cavity width $W_i$ for each chip i having thickness offset $X_i$. In this approach, the common mask width is chosen with reference to the thinnest chip in the assembly, so that the cavity width prior to the timed anisotropic etching step is at least as narrow as $W_i$ for the thinnest chip. An advantage of this approach is that a single photopattern mask and one common photo exposure condition is required for all different chip thicknesses, saving major mask costs. In both these approaches the resulting cavity widths are as defined by Equation (1) and, for chips from a <1 0 0> silicon wafer, Equation (2). Note that so long as a common etching angle $\beta$ can be closely maintained, it is feasible to include in an assembly chips made from gallium arsenide and other semiconductor crystals.

Figure 5A:
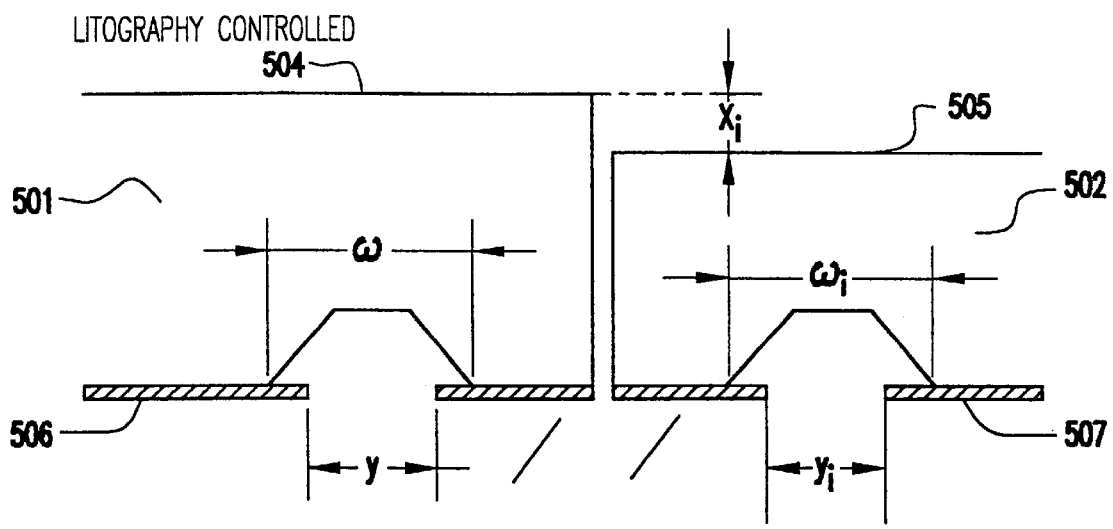
FIGS. 5A and 5B are cross sectional schematics showing implementation of the invention with chips of different thicknesses using controlled lithography.
Figure 5B:
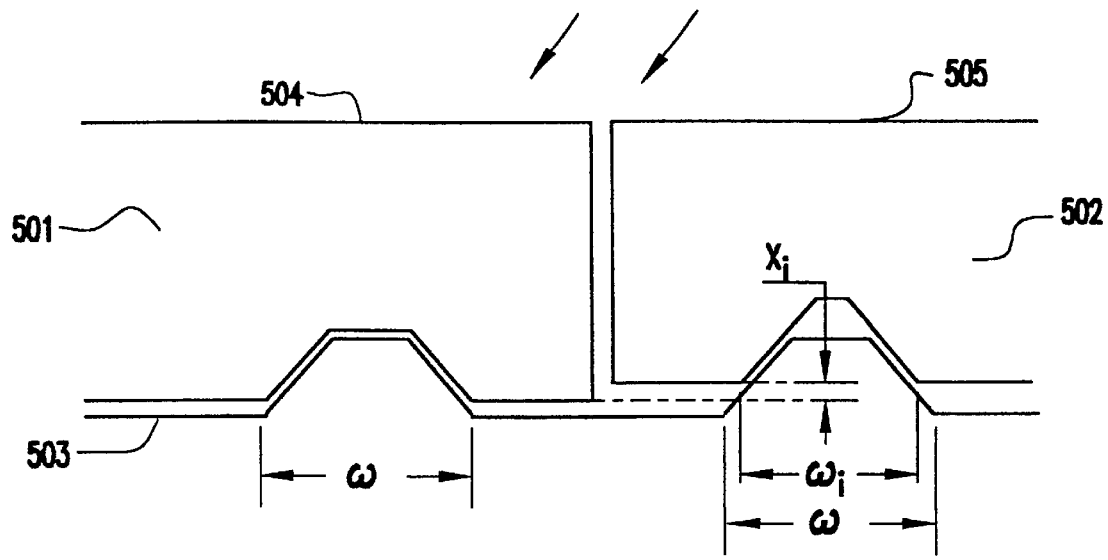

The lithography controlled approach is shown with reference to FIGS. 5A and 5B. The left side of FIG. 5A shows a mask exposure width y in the resist 506 for reference chip 501, which results in a cavity having width W. The reference chip 501 (typically the thickest chip in an assembly) is shown in the left side of FIG. 5B with the cavity aligned over a mesa of width W projecting out of the upper surface 503 of the carrier. Because the widths of the cavity and corresponding mesa are the same, the reference chip will seat fully on the carrier.

Now turning to the right side of FIG. 5A, there is shown a chip i which is thinner than the reference chip by the thickness offset $X_i$. Thus the device side 505 of chip i 502 is not in the same plane as the device side 504 of the reference chip 501, the respective planes being separated by the thickness offset $X_i$. The right side of FIG. 5A shows a mask exposure width $y_i$ in the resist 507 for chip i 502, which results in a cavity having adjusted width $W_i$. Upon alignment of chip i 502 with its cavity over the corresponding mesa having width W and projecting from the upper surface 503 of the carrier, the bottom surface of chip i 502 is elevated by an amount $X_i$ with respect to the bottom surface of the reference chip 501. Consequently, the device surface 505 of chip i 502 is co-planar with the device surface 504 of reference chip 501.

Figure 6A:
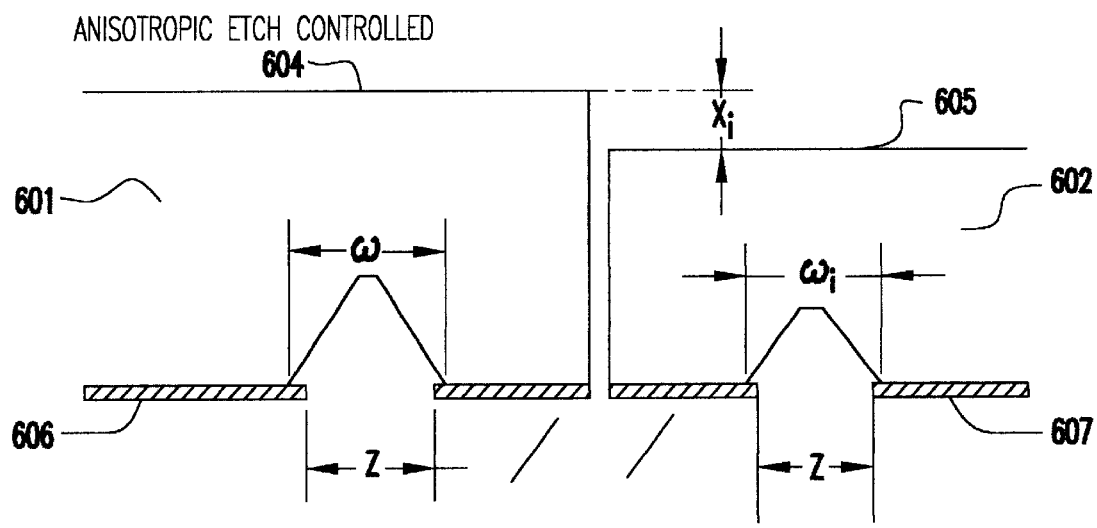
FIGS. 6A and 6B are cross sectional schematics showing implementation of the invention with chips of different thicknesses using controlled anisotropic etching.
Figure 6B:
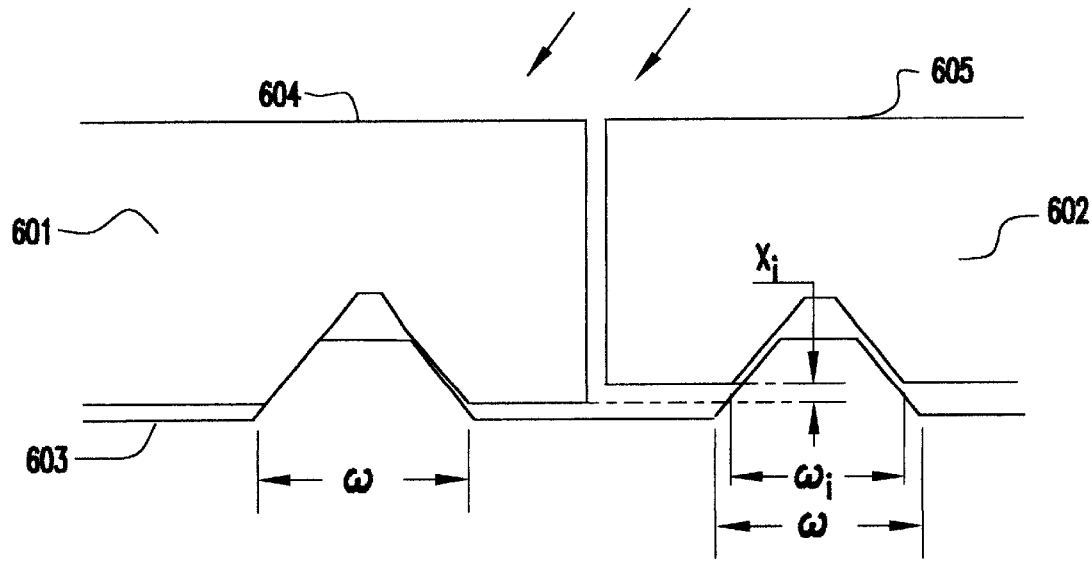

The anisotropic etch controlled approach is shown with reference to FIGS. 6A and 6B. FIG. 6A shows a common mask exposure width Z in the $S_iO_2$ layer 606 for reference chip 601 and also in the $S_iO_2$ layer 607 for chip i 602. As indicated above, the exposure width Z will be chosen so that the cavity width prior to the timed anisotropic etching step is at least as narrow as $W_i$ for the thinnest chip (i. e. for the largest $X_i$). Consequently, the timed anisotropic etching step will be longer for the thicker chips which require cavity widths wider than the cavity width required for the thinnest chip. Because of the attributes of anisotropic etching, the depth of the cavity for the reference chip (typically, the thickest chip in the assembly) will be greater than for the lithography controlled approach, as will be seen from a comparison of the left sides of FIG. 5B and FIG. 6B. However, in both approaches the result is a reference chip cavity having width W, which will seat fully on the carrier when self aligned over the corresponding mesa.

Now turning to the right side of FIG. 6A, there is shown a chip i 602 which is thinner than the reference chip by the thickness offset $X_i$. Thus the device side 605 of chip i 602 is not in the same plane as the device side 604 of the reference chip 601, the respective planes being separated by the thickness offset $X_i$. As stated above, the right side of FIG. 6A shows the same mask exposure width Z in the resist 607 for chip i 602 as in the resist 606 for reference chip 601.

After timed anisotropic etching, the result is a cavity having an adjusted width $W_i$. Upon alignment of chip i 602 with its cavity over the corresponding mesa having width W and projecting from the upper surface 603 of the carrier, the bottom surface of chip i 602 is elevated by an amount $X_i$ with respect to the bottom surface of the reference chip 601. Consequently, the device surface 605 of chip i 602 is co-planar with the device surface 604 of reference chip 501.

Note that in practice there will be multiple cavities self aligning over corresponding mesas for each chip, in both the lithography controlled and anisotropic etch controlled approaches, and the single cavity and mesa alignment shown in FIGS. 5B and 6B is for simplicity of illustration. Further, the cavities and mesas will have four sides, as shown in FIG. 4A, rather than the two sides shown here for simplicity of illustration.

While the invention has been described in terms of preferred embodiments, those skilled in the art will recognize that the invention can be practiced with modification within the spirit and scope of the appended claims.

Having thus described my invention, what I claim as new and desire to secure by Letters Patent is as follows:

1. An integrated circuit package, comprising:

a carrier having a topography of mesas projected from a surface, said mesas having inwardly sloping sides; and individual semiconductor circuit chips, each said semiconductor circuit chip having a device side surface and an opposite bottom surface, said opposite bottom surface having a topography of a recess conversely matching a respective one of said mesas of said carrier to permit self-aligned positioning of each said semiconductor circuit chip on said carrier, wherein said individual semiconductor circuit chips have variations in a chip thickness, each said semiconductor circuit chip having said chip thickness less than or equal to a reference thickness, the difference between said chip thickness and said reference thickness being a thickness offset, and wherein a width of said recess in said opposite bottom surface of each said semiconductor circuit chip is controlled so that for each said individual semiconductor circuit chip, alignment of said recess on the respective one of said mesas of said carrier elevates said opposite bottom surface above said carrier surface by an amount equal to said respective thickness offset, thereby placing said device side surface of said semiconductor circuit chip in the same plane.

2. The integrated circuit package of claim 1, wherein each said chip is formed from a crystallographic wafer cut along a <1 0 0> surface of said crystallographic wafer and wherein each of said sloping sides are parallel to a <1 1 1> surface of said crystallographic wafer.

3. The integrated circuit package of claim 2, wherein said <1 0 0> surface and said <1 1 1> surface have a fixed angular separation.

4. The integrated circuit package of claim 3, wherein said fixed angular separation is that of a silicon crystal, being 54.7°.

5. The integrated circuit package of claim 4, wherein a chip having said reference thickness has an increased cavity depth reflecting timed anisotropic etching.

6. The integrated circuit package of claim 1, wherein a chip having said reference thickness has an increased cavity depth reflecting timed anisotropic etching.

7. The integrated circuit package of claim 1, wherein said thickness offsets are less than 3 µm.

8. The integrated circuit package of claim 1, wherein said thickness offsets are less than 1.5 µm.

9. The integrated circuit package of claim 1, wherein for at least one said individual circuit chip the inwardly sloping sides of at least one said mesa abut said respective recess on two opposite sides.

10. The integrated circuit package of claim 9, wherein a chip having said reference thickness has an increased cavity depth reflecting timed anisotropic etching.

* * * * *